US007900328B2

(12) United States Patent
Suzawa et al.

(10) Patent No.: US 7,900,328 B2
(45) Date of Patent: Mar. 8, 2011

(54) METHOD FOR MANUFACTURING FLUID EJECTING HEAD AND METHOD FOR MANUFACTURING FLUID EJECTING APPARATUS

(75) Inventors: Hitoshi Suzawa, Matsumoto (JP); Toshikazu Niki, Matsumoto (JP); Takateru Yamashita, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 34 days.

(21) Appl. No.: 12/209,475

(22) Filed: Sep. 12, 2008

(65) Prior Publication Data

US 2009/0071004 A1 Mar. 19, 2009

(30) Foreign Application Priority Data

Sep. 14, 2007 (JP) ................................ 2007-239444

(51) Int. Cl.

| | |
|---|---|
| ***H01L 41/00*** | (2006.01) |
| ***H04R 17/00*** | (2006.01) |
| ***B23P 17/00*** | (2006.01) |
| ***B21D 53/76*** | (2006.01) |
| ***B41J 2/15*** | (2006.01) |
| ***B41J 2/145*** | (2006.01) |
| ***B41J 2/135*** | (2006.01) |

(52) U.S. Cl. ............ 29/25.35; 29/890.1; 347/40; 347/44

(58) Field of Classification Search ................. 29/25.35, 29/890.1; 347/40, 44

See application file for complete search history.

(56) References Cited

FOREIGN PATENT DOCUMENTS

| | | | |
|---|---|---|---|
| JP | 2003-053970 | | 2/2003 |
| JP | 2003053970 | * | 2/2003 |

* cited by examiner

*Primary Examiner* — A. Dexter Tugbang
*Assistant Examiner* — David P Angwin
(74) *Attorney, Agent, or Firm* — Workman Nydegger

(57) ABSTRACT

A method for manufacturing a fluid ejecting head includes providing a channel unit including a vibrating plate having nozzle openings through which fluid is ejected and a pressure chamber that communicates with the nozzle openings. A piezoelectric unit includes a piezoelectric element that vibrates the vibrating plate of the channel unit and which includes a securing plate which secures the piezoelectric element. A head case having a housing chamber houses the piezoelectric unit which is pressed against the vibrating plate in a housing direction such that a portion of the piezoelectric unit is also pressed against a sidewall of the housing chamber. The piezoelectric element is secured directly the vibrating plate and the securing plate is secured directly to head case using a bonding process which is performed while the piezoelectric unit is being pressed against the vibrating plate and the sidewall.

7 Claims, 8 Drawing Sheets

METHOD FOR MANUFACTURING FLUID EJECTING HEAD AND METHOD FOR MANUFACTURING FLUID EJECTING APPARATUS

CROSS REFERENCES TO RELATED APPLICATIONS

The present invention contains subject matter related to Japanese Patent Application No. 2007-239444 filed in the Japanese Patent Office on Sep. 14, 2007, the entire contents of which are incorporated herein by reference.

BACKGROUND

1. Technical Field

The present invention relates to methods for manufacturing fluid ejecting heads and methods for manufacturing fluid ejecting apparatuses.

2. Related Art

Examples of known fluid ejecting apparatuses that eject fluid include ink jet recording apparatuses. Ink jet recording apparatuses record characters, images, and the like on recording media and eject ink toward the recording media through nozzle openings provided in recording heads (ejecting heads). For example, JP-A-2003-53970 discloses a recording head in which nozzle openings are aligned in one direction. This head ejects ink through the nozzle openings by supplying electrical signals to piezoelectric vibrators including piezoelectric elements. To make the amounts of ink to be ejected from all the nozzle openings uniform, it is preferable that the nozzle openings and the respective piezoelectric vibrators have a uniform positional relationship. The piezoelectric vibratos are secured to a securing member disposed inside the recording head. Positions of the piezoelectric vibrators are determined by the dimensions of relevant components disposed inside the recording head.

However, if there are dimensional variations and assembly errors among such components disposed in the recording head, positional relationships between the nozzle openings and the piezoelectric vibratos may vary, leading to variations in the amount of ink to be ejected.

SUMMARY

An advantage of some aspects of the invention is that it provides a method for manufacturing a fluid ejecting head and a method for manufacturing a fluid ejecting apparatus in which the amounts of fluid to be ejected can be made uniform.

At least the following will become apparent from this specification and the accompanying drawings.

According to a first aspect of the invention, a method for manufacturing a fluid ejecting head includes providing a channel unit including a vibrating plate and having nozzle opening through which fluid is ejected and pressure chamber that communicate with the nozzle opening, providing a piezoelectric unit including piezoelectric element that vibrate the vibrating plate of the channel unit and a securing plate that secures the piezoelectric element, providing a head case having a housing chamber in which the piezoelectric unit is to be housed, housing the piezoelectric unit in the housing chamber such that the piezoelectric element is pressed against the vibrating plate, pushing the piezoelectric unit in a housing direction such that a portion of the piezoelectric unit is pressed against a sidewall of the housing chamber, and securing the piezoelectric element and the vibrating plate, and the securing plate and the head case, respectively, to each other by bonding the same together while the piezoelectric unit is being pressed against the vibrating plate and the sidewall.

In this case, the piezoelectric unit is housed in the housing chamber such that the piezoelectric elements are pressed against the vibrating plate. Further, the piezoelectric unit is pushed in a housing direction such that a portion of the piezoelectric unit is pressed against a sidewall of the housing chamber. Furthermore, the piezoelectric elements and the vibrating plate, and the securing plate and the head case, respectively, are secured and bonded to each other while the piezoelectric unit is being pressed against the vibrating plate and the sidewall. Therefore, positions of the securing plate and the piezoelectric elements in the housing chamber are fixed. Accordingly, even if there are variations in dimensions of components constituting the fluid ejecting head, lengths from the piezoelectric elements to the respective nozzle openings can be made uniform. Consequently, the amounts of ink to be ejected from the individual nozzle openings can be made uniform.

In the method according to the first aspect of the invention, it is preferable that, during the pushing, forces that act in the housing direction and in a turning direction be both applied to the piezoelectric unit, the force in the turning direction causing the piezoelectric unit to be pressed against the sidewall of the housing chamber.

In this case, during the pushing, forces that act in the housing direction and in a turning direction are both applied to the piezoelectric unit, and the force in the turning direction causes the piezoelectric unit to be pressed against the sidewall of the housing chamber. Therefore the piezoelectric unit can be easily pressed against the sidewall.

In the method according to the first aspect of the invention, it is preferable that, during the pushing, the piezoelectric unit be pushed with a pushing member while a pushing portion formed at a tip of the pushing member is pressed against a pushed portion formed at a top end of the piezoelectric unit, at least one of the pushing portion and the pushed portion having a sloping surface angled with respect to the housing direction, the sloping surface contributing to application of the force in the turning direction to the piezoelectric unit.

In this case, during the pushing, the piezoelectric unit is pushed with a pushing member while a pushing portion formed at a tip of the pushing member is pressed against a pushed portion formed at a top end of the piezoelectric unit. Further, at least one of the pushing portion and the pushed portion has a sloping surface angled with respect to the housing direction. Furthermore, the sloping surface contributes to application of the force in the turning direction to the piezoelectric unit. Therefore the piezoelectric unit can be easily pressed against the sidewall.

In the method according to the first aspect of the invention, it is preferable that the sloping surface be formed in the pushing portion at a first angle with respect to the pushed portion.

In this case, the sloping surface is formed in the pushing portion at a first angle with respect to the pushed portion. Therefore, when the piezoelectric unit is pushed, a turning force produced in accordance with the first angle can be applied to the piezoelectric unit. Accordingly, the piezoelectric unit can be easily pressed against the sidewall. Moreover, by providing the sloping surface in the pushing portion, burdens in manufacturing relevant components can be reduced.

In the method according to the first aspect of the invention, it is preferable that the sloping surface be formed in the pushed portion at a second angle with respect to the pushing portion.

In this case, the sloping surface is formed in the pushed portion at a second angle with respect to the pushing portion. Therefore, when the piezoelectric unit is pushed, a turning force produced in accordance with the second angle can be applied to the piezoelectric unit. Accordingly, the piezoelectric unit can be easily pressed against the sidewall.

In the method according to the first aspect of the invention, it is preferable that at least a portion of the sidewall slope in an outward direction with respect to a plan-view center of the housing chamber.

In this case, at least a portion of the sidewall slopes in an outward direction with respect to a plan-view center of the housing chamber. Accordingly, the mouth of the housing chamber through which the piezoelectric unit is inserted has a diameter larger than the diameter at a portion of the housing chamber onto which the piezoelectric unit is secured. Therefore, the piezoelectric unit can be easily inserted into the housing chamber. Moreover, the sloping sidewall facilitates tilting of the piezoelectric unit. Therefore, when the piezoelectric unit is pushed with the pushing member, a turning force can be easily applied to the piezoelectric unit.

According to a second aspect of the invention, a method for manufacturing a fluid ejecting apparatus that includes a fluid ejecting head having nozzles through which fluid is ejected is provided. The method includes manufacturing the fluid ejecting head by the method according to the first aspect of the invention.

In this case, a fluid ejecting head can be obtained in which the amounts of fluid to be ejected through all the nozzle openings can be made uniform. Accordingly, a high-quality fluid ejecting apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
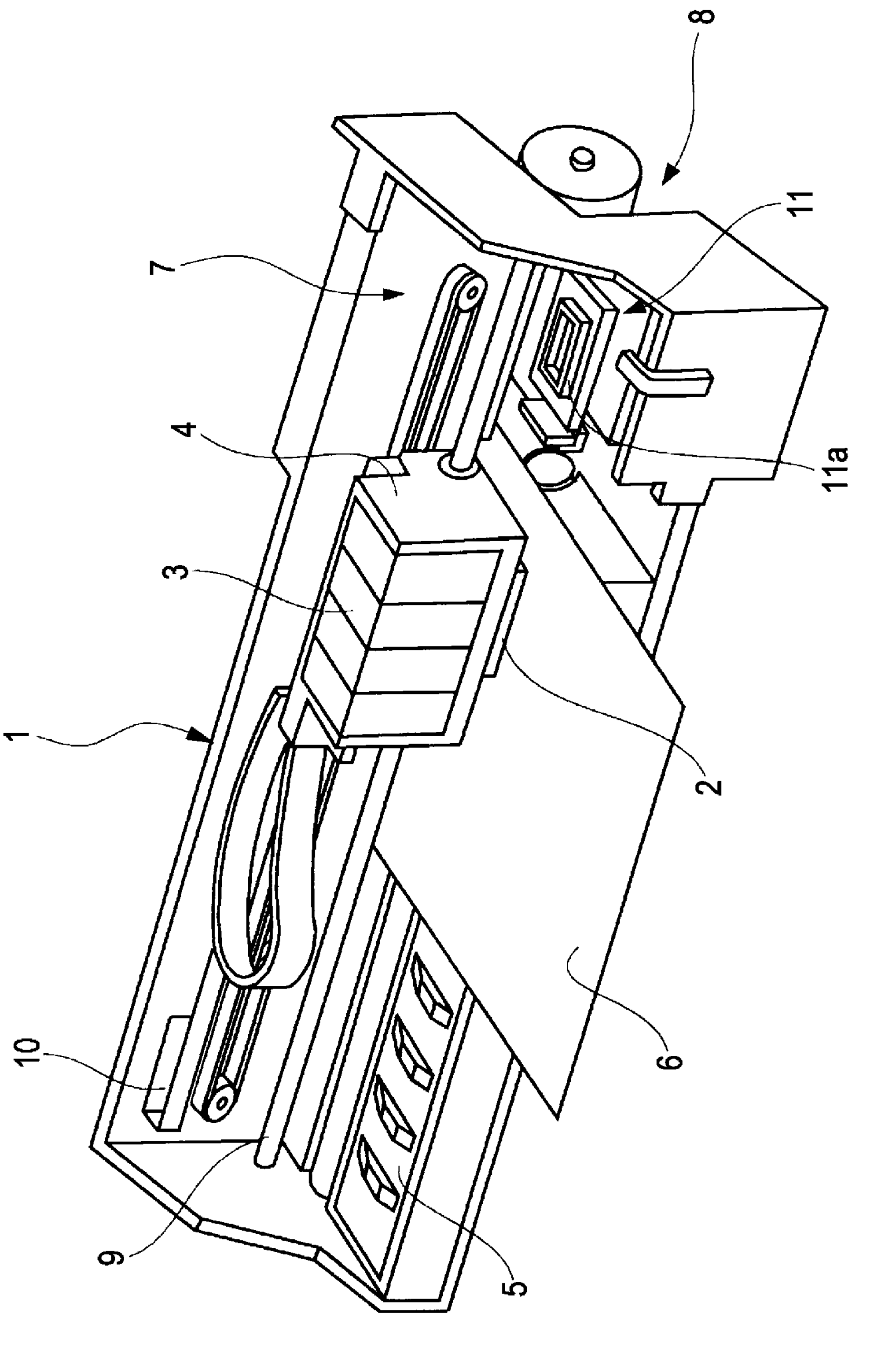
FIG. 1 schematically shows an ink jet printer according to a first embodiment of the invention.

Embodiments of the invention will now be described with reference to the drawings. In the drawings to be referred to hereinafter, scales of relevant components are changed appropriately for easier recognition. In a first embodiment, an ink jet printer is taken as an example of a fluid ejecting apparatus according to the invention.

FIG. 1 is a schematic perspective view of a printer (fluid ejecting apparatus) 1 according to the first embodiment of the invention.

Referring to FIG. 1, the printer 1 includes a carriage 4 having a head (fluid ejecting head) 2 and a detachable ink cartridge 3, i.e., a liquid storing member, a platen 5 disposed below the head 2 and over which recording paper 6 is transported, a carriage moving mechanism 7 that moves the carriage 4 in a width direction of the recording paper 6, and a paper feeding mechanism 8 that feeds the recording paper 6 in a paper feeding direction. The width direction corresponds to a main scanning direction (a direction in which the head 2 is scanningly moved). The paper feeding direction corresponds to a sub-scanning direction (a direction orthogonal to the main scanning direction). The ink cartridge 3 is not limited to the one described in the first embodiment that is attached to the carriage 4, and may be of another type, such as the one that is to be attached to a casing of the printer 1 such that ink is supplied to the head 2 through a supplying tube.

A guide rod 9 is a supporting member extending in the main scanning direction. The carriage 4 is supported by the guide rod 9. The carriage 4 is moved by the carriage moving mechanism 7 in the main scanning direction along the guide rod 9. A linear encoder 10 detects the position of the carriage 4 in the main scanning direction. A signal indicating the result of this detection is sent as positional information to a control unit (not shown). In accordance with the positional information sent from the linear encoder 10, the control unit recognizes the scanning position of the head 2 and controls operations including a recording operation (ejection operation) performed by the head 2.

A home position from which the head 2 starts moving is set to be within a range where the head 2 can be moved beyond the platen 5. A capping mechanism 11 is disposed at a position facing the home position. The capping mechanism 11 includes a cap member 11*a* that seals a surface of the head 2 having nozzle openings, thereby preventing evaporation of an ink solvent. The capping mechanism 11 is also used for performing a cleaning operation, for example, in which a negative pressure is applied to the sealed surface of the head 2 having nozzle openings so as to forcibly remove ink by means of suction.

Figure 2:
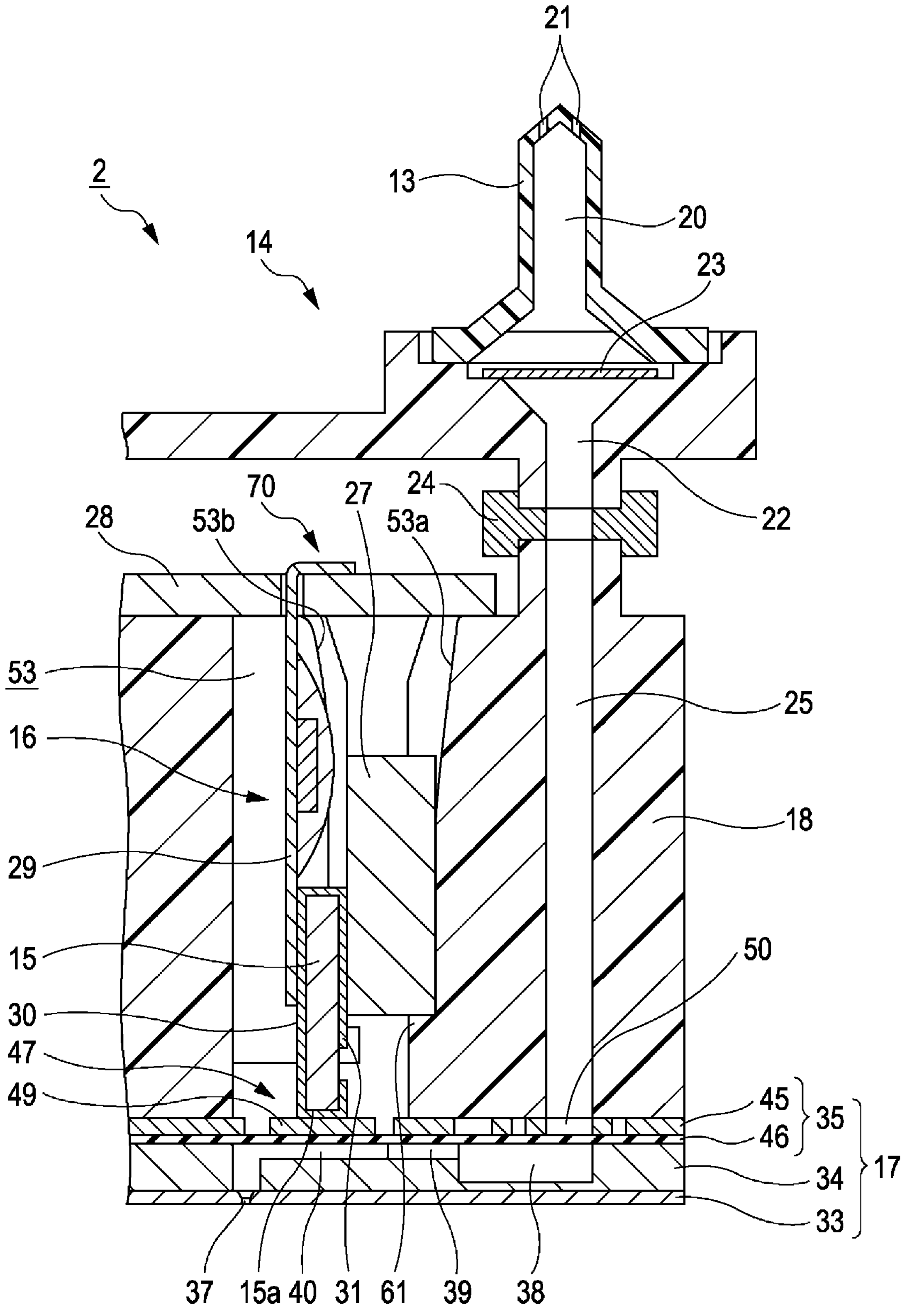
FIG. 2 is a cross-sectional view of a head.

FIG. 2 is a schematic cross-sectional view of the head 2.

As shown in FIG. 2, the head 2 includes an introduction needle unit 14 having an ink introduction needle 13 standing upright therefrom, a piezoelectric unit 16 having a plurality of piezoelectric vibrators 15, a channel unit 17 having ink channels provided therein, a head case 18 to which the piezoelectric unit 16 and the channel unit 17 are secured, and a glass-epoxy circuit board 28 that supplies driving signals to the piezoelectric vibrators 15.

The ink introduction needle 13 is a synthetic-resin member molded into a shape of a hollow needle. The hollow of the ink introduction needle 13 serves as a needle channel 20 into which ink stored in the liquid storing member (not shown), such as the ink cartridge 3 or a sub-tank, is introduced. The ink introduction needle 13 has at the tip thereof an introduction hole 21 communicating with the needle channel 20. When the ink introduction needle 13 is inserted into the liquid storing member and is held therein, ink in the liquid storing member is introduced through the introduction hole 21 into the needle channel 20.

The introduction needle unit 14 is a synthetic-resin-molded member, like the ink introduction needle 13.

The introduction needle unit 14 has an ink introduction channel 22 provided therein in such a manner as to match the ink introduction needle 13. The upstream end of the ink introduction channel 22 has a bell-like shape whose diameter gradually increases toward a position at which the ink introduction needle 13 is mounted. The ink introduction channel 22 has at the mouth thereof a filter 23 that removes foreign substances contained in ink. The ink introduction needle 13 is secured to the introduction needle unit 14 such that the bottom opening of the needle channel 20 overlaps the top opening of the ink introduction channel 22 in plan view and that the ink introduction channel 22 of the introduction needle unit 14 communicates with the needle channel 20 of the ink introduction needle 13 through the filter 23.

The piezoelectric unit 16 includes the piezoelectric vibrators (piezoelectric elements) 15, a securing plate 27 to which the piezoelectric vibrators 15 are bonded, and a flexible board 29 that supplies driving signals sent from the circuit board 28 to the piezoelectric vibrators 15. The piezoelectric vibrators 15, which are of a multilayer structure, are obtained by stacking electrodes with piezoelectric materials interposed therebetween and cutting the stack into a comb-like shape having long, fine teeth. The piezoelectric vibrators 15 are extendable and contractible in a mode in which the piezoelectric vibrators 15 vibrate in a direction orthogonal to the surface of a sealing plate 35 described separately below. The piezoelectric vibrators 15 have a fixed base portion bonded to the securing plate 27 and each have a free end extending beyond an end of the securing plate 27. The securing plate 27 is a plate-like member having a rectangular shape in plan view, and is bonded to the head case 18 while being locked at a securing-plate locker 61 provided in a sidewall 53*a* of a housing chamber 53.

The piezoelectric vibrators 15 have on surfaces thereof individual external electrodes 30, respectively, and a common external electrode 31. Each of the individual external electrodes 30 is provided over a region including one end face of the corresponding piezoelectric vibrator 15 at the tip thereof and one stacking-direction surface of the same piezoelectric vibrator 15 on which a connection wire is provided (a surface that is to be connected to the flexible board 29). The individual external electrodes 30 are electrically connected to respective individual internal electrodes (not shown) provided inside the piezoelectric vibrators 15. The common external electrode 31 is provided over a region including the other end face of the piezoelectric vibrators 15 at the base thereof and the other stacking-direction surfaces of the piezoelectric vibrators 15 at positions of which the piezoelectric vibrators 15 are secured to the securing plate 27. The common external electrode 31 is electrically connected to a common internal electrode (not shown) provided inside the piezoelectric vibrators 15.

Further, the individual external electrodes 30 are electrically connected to individual terminals of the flexible board 29, respectively, and the common external electrode 31 is electrically connected to a grounding terminal of the flexible board 29. When driving signals sent from the flexible board 29 are supplied through the individual external electrodes 30 to the piezoelectric vibrators 15, the piezoelectric materials are deformed in accordance with potential differences between the common external electrode 31 (common internal electrode) and the individual external electrodes 30 (individual internal electrodes).

The channel unit 17 includes a nozzle plate 33, a channel-forming substrate 34, and the sealing plate (vibrating plate) 35. The nozzle plate 33, the channel-forming substrate 34, and the sealing plate 35 are provided as an integral body. In the channel unit 17, the nozzle plate 33 is disposed on one surface of the channel-forming substrate 34, and the sealing plate 35 is disposed on the other surface of the channel-forming substrate 34 across from the nozzle plate 33.

The nozzle plate 33 is a stainless-steel thin plate member having a line of nozzle openings 37 bored therein. The channel-forming substrate 34 is a plate-like member obtained from a silicon wafer, for example, and has a base channel portion serving as a series of ink channels including a common ink chamber 38, ink supply ports 39, and pressure chambers 40. The pressure chambers 40 are each provided longitudinally orthogonal to a direction in which the nozzle openings 37 are aligned (a nozzle-opening-line direction). The ink supply ports 39 each form an orifice, having a narrow channel width, that communicate the common ink chamber 38 and the corresponding pressure chamber 40. The common ink chamber 38 temporarily stores ink introduced through the ink introduction needle 13 and supplied through the ink introduction channel 22 and a case channel 25. The ink stored in the common ink chamber 38 is supplied through the ink supply ports 39 to the pressure chambers 40.

The sealing plate 35 is a composite plate member constituted by two layers including a support substrate 45, which is a conductive member composed of stainless steel or the like, and an elastic film 46, which is an insulative flexible film composed of polyphenylene sulfide (PPS) or the like, laminated on the support substrate 45. The sealing plate 35 is disposed such that one surface thereof having the elastic film 46 is bonded to the channel-forming substrate 34 and the other surface thereof having the support substrate 45 is bonded to the bottom of the head case 18. A portion of the sealing plate 35 that seals spaces serving as the pressure chambers 40 from one side serves as a diaphragm portion 47, with which the capacities of the pressure chambers 40 are changed. The diaphragm portion 47 has islands 49 provided in correspondence with the pressure chambers 40. Tips 15*a* of the piezoelectric vibrators 15 are bonded to the islands 49. The islands 49 each have a shape of a long, narrow block longitudinally orthogonal to the line of the nozzle openings 37.

The head case 18 is a hollow block-like member composed of synthetic resin and is bonded to the channel unit 17. The head case 18 has the housing chamber 53 in which the piezoelectric unit 16 is housed and the case channel 25 through which ink from the introduction needle unit 14 is supplied to the channel unit 17. The housing chamber 53 extends through the head case 18 in a direction of the height thereof: from the bottom surface, to which the channel unit 17 is attached, to the top surface, to which the introduction needle unit 14 and the circuit board 28 are attached. The diaphragm portion 47 of the sealing plate 35 is positioned in the bottom opening of the housing chamber 53. The case channel 25 communicates with the common ink chamber 38 through an ink introduction hole 50. The bottom surface of the head case 18 is bonded to the one surface of the sealing plate 35 having the support substrate 45. The sidewall 53*a* and another sidewall 53*b* of the housing chamber 53 each slope in an outward direction starting from a height halfway in the housing chamber 53 to the top opening of the housing chamber 53 such that the diameter of the opening of the housing chamber 53 in plan view increases with respect to the center of the opening.

The introduction needle unit 14 is attached to the head case 18 with a packing 24 interposed therebetween. The ink introduction channel 22 of the introduction needle unit 14 communicates with the case channel 25 of the head case 18 through the packing 24.

The circuit board 28, which is disposed on the top surface of the head case 18, is bonded to the flexible board 29 at a bonding portion 70.

Next, a process for manufacturing the head 2 will be described. FIGS. 3 to 6 show steps through which the piezoelectric unit 16 is housed and secured in the housing chamber 53.

Figure 3:
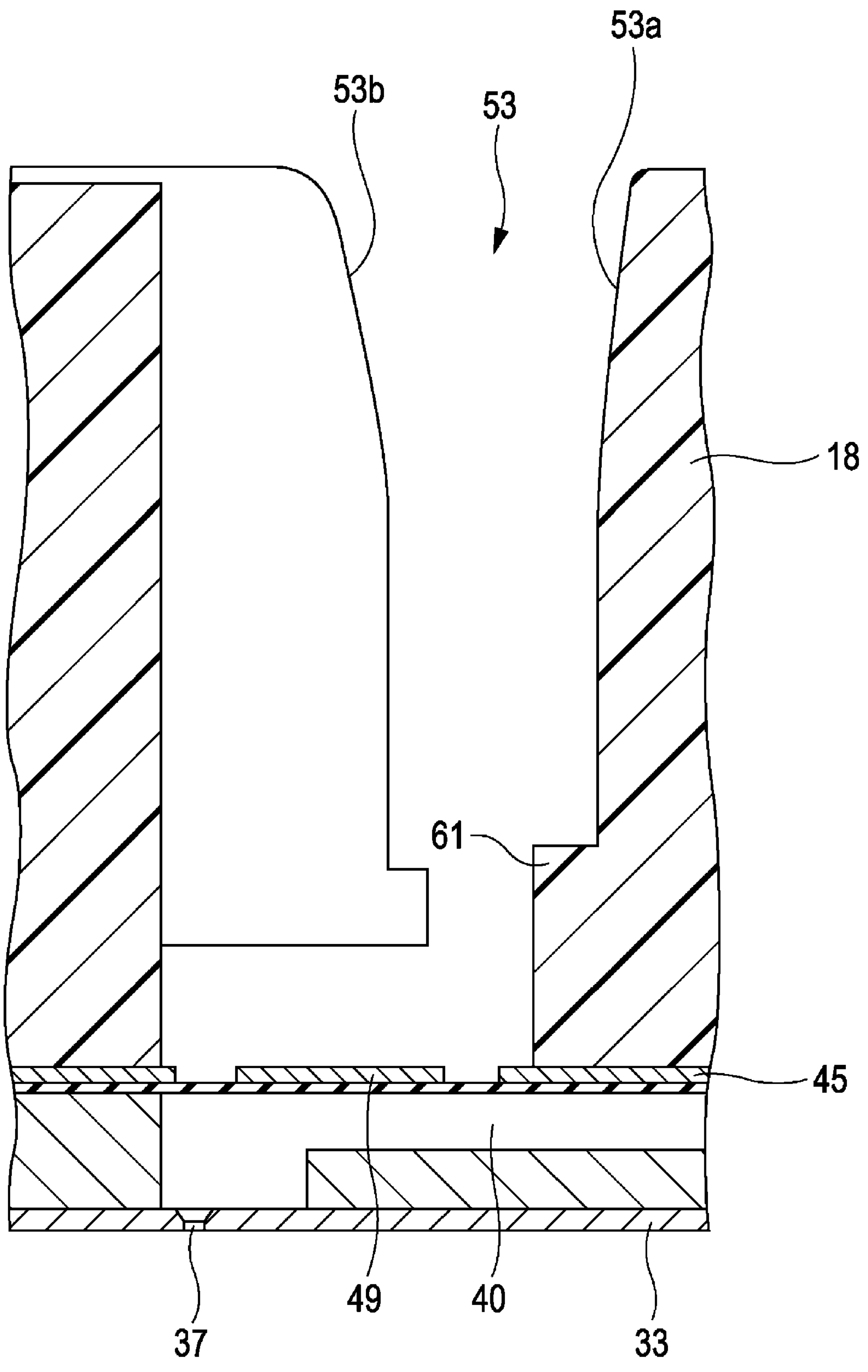
FIG. 3 shows a step included in a process for manufacturing the head.
Figure 4:
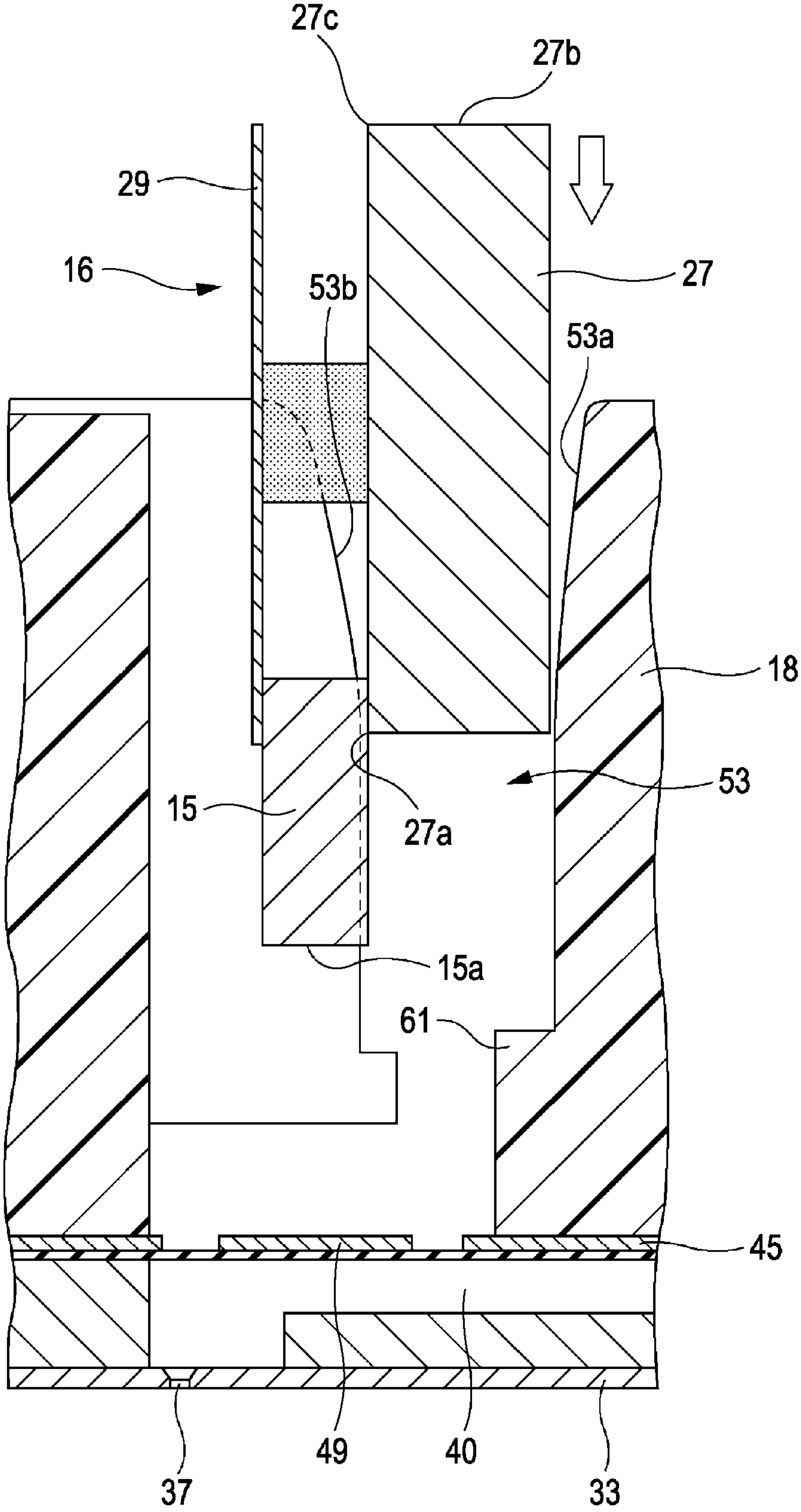
FIG. 4 shows another step included in the process for manufacturing the head.

First, the piezoelectric unit 16 is housed in the housing chamber 53 shown in FIG. 3. In this housing step, referring to FIG. 4, the piezoelectric unit 16 is inserted through the top opening of the housing chamber 53 in a direction along the sidewall 53*a* of the housing chamber 53 (a downward direction in FIG. 4: a housing direction) such that the tips 15*a* of the piezoelectric vibrators 15 are pressed against the islands 49 of the sealing plate 35. Thus, the piezoelectric unit 16 is housed in the housing chamber 53.

Then, the piezoelectric unit 16 is pushed in the housing direction, whereby a portion of the piezoelectric unit 16 is pressed against the sidewall 53*b* of the housing chamber 53 (a pushing step). In this step, referring to FIG. 5, a pushing member 60 is used to push the top end of the securing plate 27 included in the piezoelectric unit 16. The tip of the pushing member 60 forms a sloping surface 60*a* angled at a first angle θ1 with respect to a top end face 27*b* of the securing plate 27. The securing plate 27 is pushed in the housing direction (a direction indicated by the black arrow in FIG. 5), with the sloping surface 60*a* of the pushing member 60 being pressed against an edge (pushed portion) 27*c* at the top end of the securing plate 27 having a rectangular shape. More specifically, the sloping surface 60*a* is pressed against the edge 27*c*, which is one of the edges at the top end of the securing plate 27 near to the nozzle openings 37. When the securing plate 27 is pushed with the pushing member 60, a force is applied to the edge 27*c* in a rightward direction (a direction indicated by the upper white arrow) in FIG. 5 because of the sloping surface 60*a* of the pushing member 60. With this force, the securing plate 27 is tilted in the rightward direction in FIG. 5, whereby the right side face of the securing plate 27 is pressed against the sidewall 53*a*. When the securing plate 27 is further pushed with the pushing member 60, the right side face of the securing plate 27 is further tilted, with a point on the sidewall 53*a* from which the sidewall 53*a* starts to slope acting as a fulcrum, whereby a turning force is applied to a bottom edge 27*a* of the securing plate 27 in a leftward direction (a direction indicated by the lower white arrow) in FIG. 5.

Figure 6:
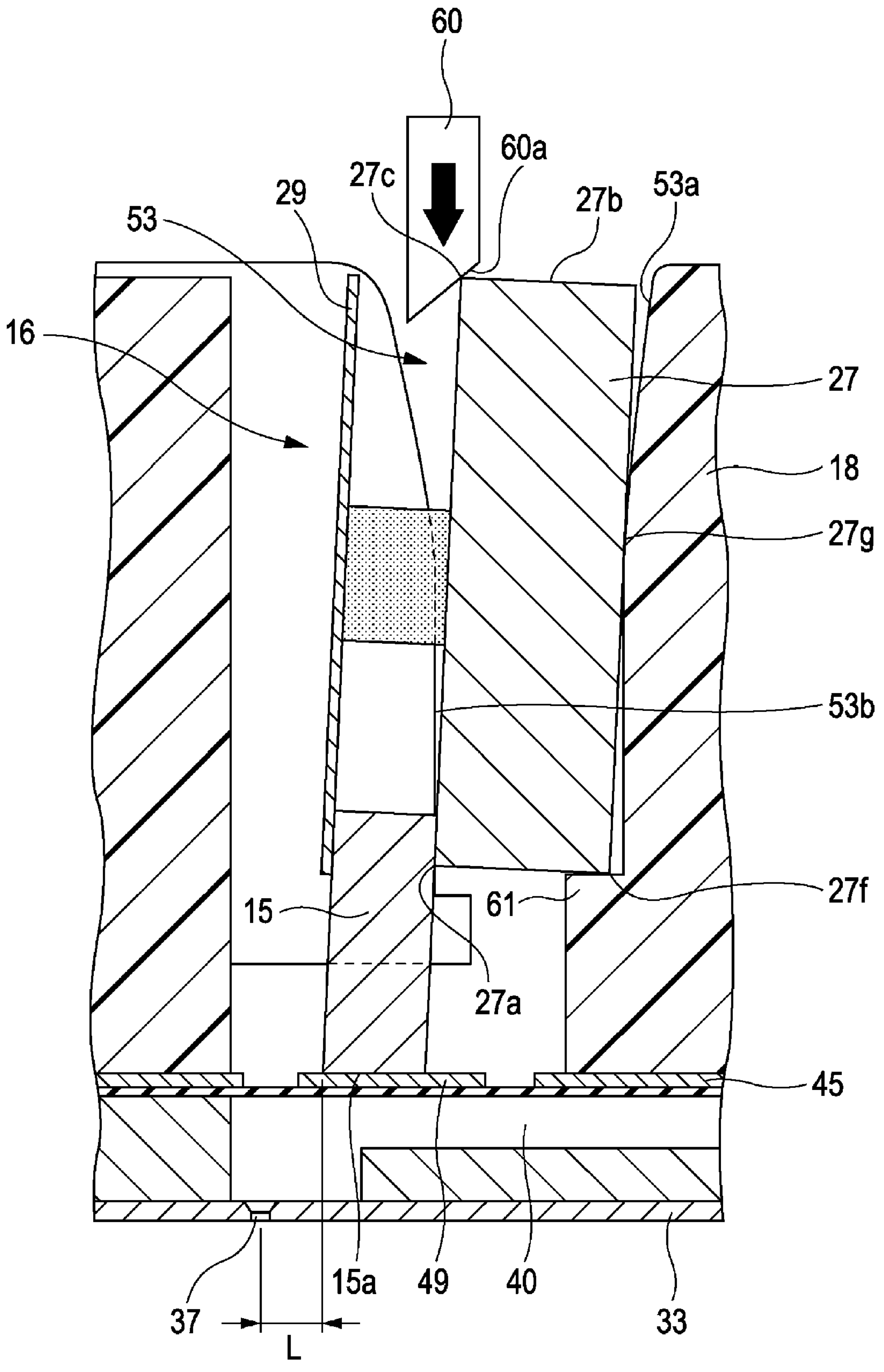
FIG. 6 shows another step included in the process for manufacturing the head.

With this turning force, referring to FIG. 6, the bottom edge 27*a* of the securing plate 27 near to the sidewall 53*b* is pressed (at an angle) against the sidewall 53*b*. The piezoelectric vibrators 15 are slid in a leftward direction in FIG. 6 (a direction toward the nozzle openings 37) while the tips 15*a* thereof are being pressed against the islands 49. Since the sidewall 53*a* slopes in an outward direction starting from a height halfway in the housing chamber 53 to the top opening of the housing chamber 53 as described above, the securing plate 27 can be inserted easily and a turning force can be produced easily, with the point from which the sidewall 53*a* starts to slope acting as a fulcrum. In this step, the bottom edge 27*a* of the securing plate 27 is pressed against the sidewall 53*b*, a bottom edge 27*f* of the securing plate 27 is pressed against the securing-plate locker 61, and a side face 27*g* of the securing plate 27 is pressed against a point halfway on the sidewall 53*a*.

Next, while the bottom edge 27*a* of the securing plate 27 is being pressed against the sidewall 53*b*, the piezoelectric vibrators 15 and the respective islands 49 are bonded and secured to each other and the securing plate 27 and the head case 18 are also bonded and secured to each other (a securing step). For example, a heat-curable adhesive is first applied to the tips 15*a* of the piezoelectric vibrators 15 (or the islands 49) and the bottom edge 27*a* of the securing plate 27 (or the sidewall 53*b*), and heat is applied to the adhesive while the bottom edge 27*a* of the securing plate 27 is being pressed against the sidewall 53*b*. Thus, the adhesive is cured and the above components are bonded to each other.

Subsequently, other components such as the introduction needle unit 14, the channel unit 17, and the head case 18 are assembled together, whereby the head 2 is obtained. Further, the head 2 is assembled with other components such as the carriage 4, the platen 5, the carriage moving mechanism 7, and the paper feeding mechanism 8, whereby the printer 1 is obtained.

Figure 7:
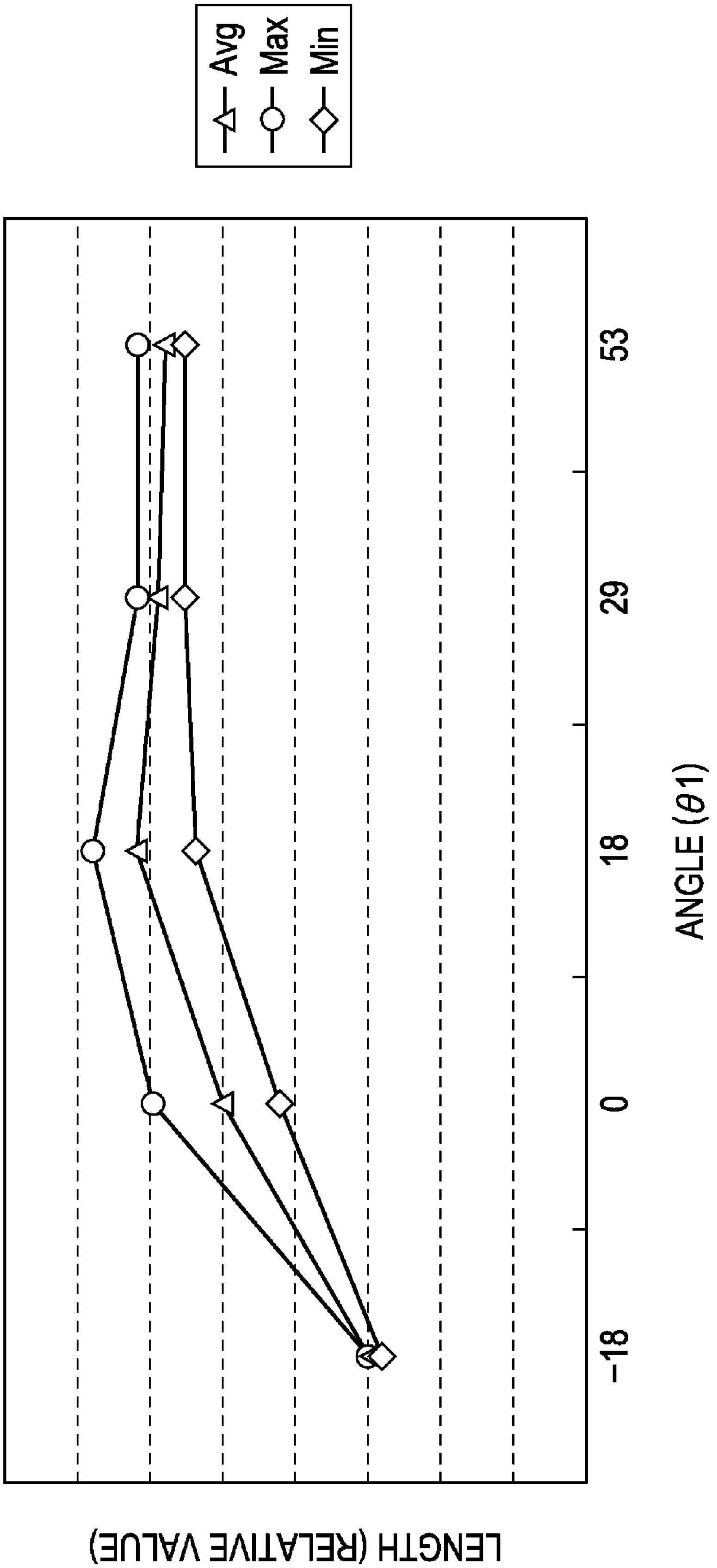
FIG. 7 is a graph showing relationships between the angle of a sloping surface and lengths from nozzle openings to tips of piezoelectric vibrators.

FIG. 7 is a graph showing relationships between the angle θ1 of the sloping surface 60*a* of the pushing member 60 and lengths L (see FIG. 6) from the nozzle openings 37 to the tips 15*a* of the piezoelectric vibrators 15 (hereinafter simply referred to as the "tips 15*a*"). In this graph, the horizontal axis indicates the angle θ1, and the vertical axis indicates the lengths (relative values) from the nozzle openings 37 to the tips 15*a*. The line shown with circular dots indicates variations in the maximum value among the lengths from the nozzle openings 37 to the tips 15*a*. The line shown with diamond-shaped dots indicates variations in the minimum value among the lengths from the nozzle openings 37 to the tips 15*a*. The line shown with triangular dots indicates variations in the average value of the lengths from the nozzle openings 37 to the tips 15*a*.

In FIG. 7, as the angle θ1 increases from the case where the angle θ1 is 0° (the case of a known configuration) the maximum and minimum values among the lengths from the nozzle openings 37 to the tips 15*a* come closer to the average value, whereby the difference therebetween becomes smaller. This means that the lengths from the nozzle openings 37 to the tips 15*a* become more uniform. In the range where the angle θ1 is set to be 18° or larger, the lengths from the nozzle openings 37 to the tips 15*a* gradually become uniform. In particular, in the range where the angle θ1 is set to be 30° or larger, the lengths from the nozzle openings 37 to the tips 15*a* are highly uniform. FIG. 7 shows that it is preferable to set the angle θ1 to be within the range from about 30° to 53°.

The first embodiment can be summarized as follows. The piezoelectric unit 16 is housed in the housing chamber 53 such that the piezoelectric vibrators 15 are pressed against the islands 49 of the sealing plate 35. Then, the piezoelectric unit 16 is pushed in the housing direction such that the bottom edge 27*a* of the securing plate 27 is pressed (at an angle) against the sidewall 53*b* of the housing chamber 53. Subsequently, while the piezoelectric unit 16 is pressed against the islands 49 and the sidewall 53*b*, the piezoelectric vibrators 15 and the islands 49, and the securing plate 27 and the sidewall 53*a* are respectively bonded and secured to each other. Therefore, positions of the securing plate 27 and the piezoelectric vibrators 15 in the housing chamber 53 are fixed. Accordingly, even if there are variations in dimensions of components constituting the head 2, lengths from the piezoelectric vibrators 15 to the respective nozzle openings 37 can be made uniform. Consequently, the amounts of ink to be ejected from the individual nozzle openings 37 can be made uniform.

The technical scope of the invention is not limited to the first embodiment, and changes can be made to the first embodiment within the scope of the invention.

Figure 8:
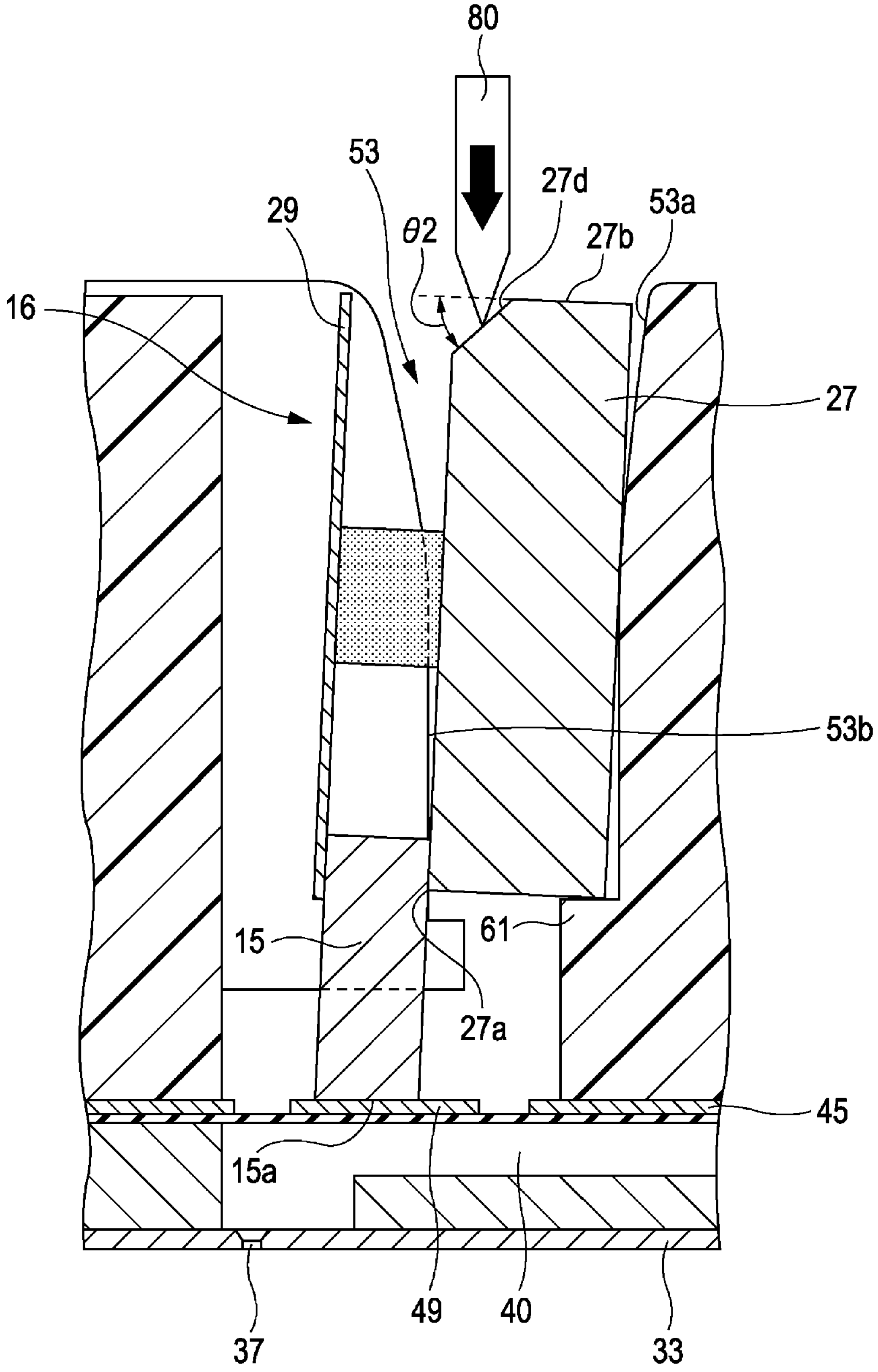
FIG. 8 shows a process for manufacturing a head according to another embodiment of the invention.

The first embodiment concerns a configuration in which the pushing member 60 has the sloping surface 60*a* with which the edge 27*c* at the top end of the securing plate 27 is pushed. Alternatively, another configuration may be employed. For example, referring to FIG. 8, the top end face 27*b* of the securing plate 27 may have a sloping surface 27*d*. The sloping surface 27*d* is set to be angled at a second angle θ2 with respect to a direction orthogonal to the pushing direction. The second angle θ2 may be set to be within the same range as in the case of the first angle θ1. When the sloping surface (pushed portion) 27*d* is pushed with a pushing member 80, a turning force is applied to the securing plate 27. In this case, the pushing member 80 does not necessarily have a sloping surface.

Figure 5:
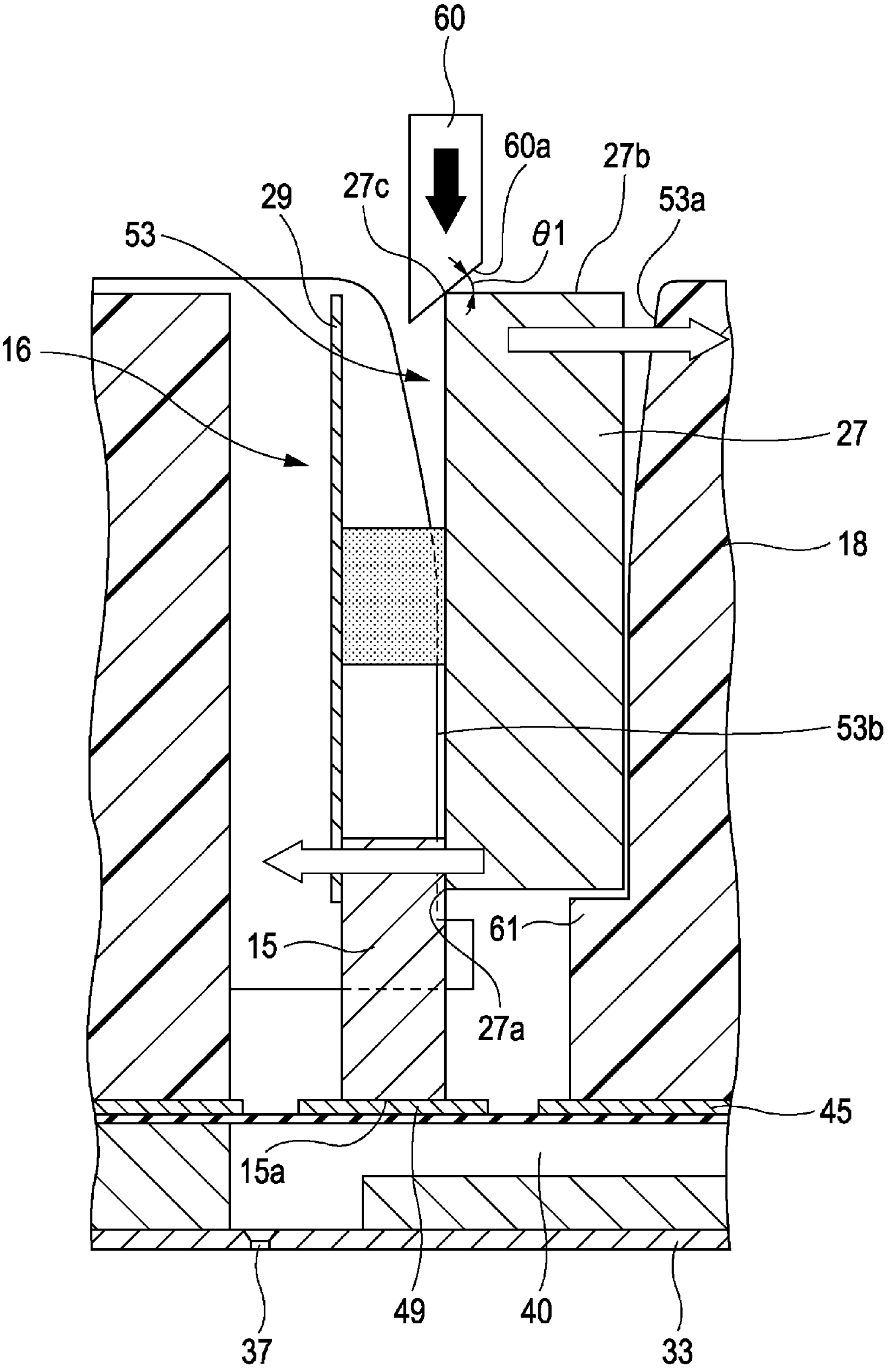
FIG. 5 shows another step included in the process for manufacturing the head.

The sloping surface 60*a* of the pushing member 60 in the first embodiment may be angled at the angle θ1 in a direction opposite to the one shown in FIG. 5 (a negative angle). By setting the sloping surface 60*a* to be angled in the opposite direction, a turning force in a direction opposite to the one shown in FIG. 5 is produced. In this case, the bottom edge 27*f* of the securing plate 27 near to the sidewall 53*a* is pressed (at an angle) against the sidewall 53*a*. Consequently, positions of the piezoelectric vibrators 15 are fixed in a state where the piezoelectric vibrators 15 are slid in a direction away from the nozzle openings 37.

In the first embodiment, the piezoelectric vibrators 15 and the securing plate 27 are bonded together in a state where the securing plate 27 is being pressed against a sidewall by being pushed with the pushing member 60. The invention is not limited to such a configuration. Needless to say, the piezoelectric vibrators 15 and the securing plate 27 may be bonded together in a state where the piezoelectric vibrators 15, not the securing plate 27, are being pressed against a sidewall, for example.

In the first embodiment, the sidewalls 53*a* and 53*b* of the housing chamber 53 each slope in an outward direction starting from a height halfway in the housing chamber 53 to the top opening of the housing chamber 53 with respect to the plan-view center of the housing chamber 53. The invention is not limited to such a configuration. For example, the sidewalls 53*a* and 53*b* may each slope in an outward direction generally from the bottom to the top thereof with respect to the plan-view center of the housing chamber 53. Also in such a configuration, the diameter of the housing chamber 53 increases toward the top thereof. Therefore, the piezoelectric unit 16 can be inserted easily. Moreover, a turning force can be easily applied to the piezoelectric unit 16 when the piezoelectric unit 16 is pushed with the pushing member 60. As another alternative, a middle portion of each of the sidewalls 53*a* and 53*b* at a height halfway thereon may slope in an outward direction with respect to the plan-view center of the housing chamber 53.

In any of the above-described embodiments, the fluid to be ejected from the fluid ejecting apparatus is not limited to ink, and fluid for any other specific use may be ejected. If a fluid ejecting apparatus is provided with an ejecting head capable of ejecting fluid suitable for a specific use and the fluid is ejected through the ejecting head so that the fluid adheres to a desired object, a desired device can be manufactured. For example, the fluid ejecting apparatus of the invention can be applied to a fluid ejecting apparatus that ejects fluid in which a material such as an electrode material or a colorant used for manufacturing liquid crystal displays, electroluminescence (EL) displays, and field emission displays (FEDs) is dispersed (dissolved) in a desired dispersion medium.

The fluid ejecting apparatus may be a fluid ejecting apparatus that ejects a bioorganic material used for manufacturing biochips, or a fluid ejecting apparatus that is used as a precision pipette and ejects fluid serving as a specimen.

Further, the invention may be applied to any one of the following: a fluid ejecting apparatus that ejects lubricant to a precision instrument, such as a clock or a camera, with pinpoint accuracy, a fluid ejecting apparatus that ejects toward a substrate transparent resinous liquid, such as ultraviolet-curable resin, for forming a micro-hemispherical lens (an optical lens) used for optical communications devices and the like, a fluid ejecting apparatus that ejects etching liquid composed of acid, alkali, or the like for etching a substrate or the like, a fluid ejecting apparatus that ejects a gel material, and a toner jet recording apparatus that ejects a solid material such as powder toner.

What is claimed is:

1. A method for manufacturing a fluid ejecting head, comprising:

providing a channel unit including a vibrating plate and having nozzle openings formed therein through which fluid is ejected, the channel unit also including a pressure chamber that communicates with the nozzle opening;

providing a piezoelectric unit including a piezoelectric element that vibrates the vibrating plate of the channel unit, the piezoelectric unit also including a securing plate that secures the piezoelectric element;

providing a head case having a housing chamber in which the piezoelectric unit is to be housed;

housing the piezoelectric unit in the housing chamber such that the piezoelectric element is pressed against the vibrating plate;

pushing the piezoelectric unit in a housing direction which is the same direction that the piezoelectric element is pressed against the vibrating plate such that a portion of the piezoelectric unit is pressed against a sidewall of the housing chamber; and securing the piezoelectric element directly to the vibrating plate while the securing plate is secured directly to the head case using a bonding process which is performed at the same time while the piezoelectric unit is being pressed against the vibrating plate and the sidewall.

2. The method according to claim 1, wherein, during the pushing, forces that act in the housing direction and in a turning direction which is perpendicular to the housing direction are both applied to the piezoelectric unit, the force in the turning direction causing the piezoelectric unit to be pressed against the sidewall of the housing chamber.

3. The method according to claim 1, wherein, during the pushing, the piezoelectric unit is pushed with a pushing member while a pushing portion formed at a tip of the pushing member is pressed against a pushed portion formed at a top end of the piezoelectric unit, at least one of the pushing portion and the pushed portion having a sloping surface angled with respect to the housing direction, the sloping surface contributing to application of the force in the turning direction to the piezoelectric unit.

4. The method according to claim 1, wherein the sloping surface is formed in the pushing portion at a first angle with respect to the pushed portion.

5. The method according to claim 1, wherein the sloping surface is formed in the pushed portion at a second angle with respect to the pushing portion.

6. The method according to claim 1, wherein at least a portion of the sidewall slopes in an outward direction with respect to a plan-view center of the housing chamber.

7. A fluid ejecting apparatus that includes a fluid ejecting head having nozzles through which fluid is ejected, the fluid ejecting apparatus comprising:

a fluid ejecting head manufactured by the method according to claim 1.

* * * * *